United States Patent [19]

Pozzetti et al.

[11] Patent Number: 4,858,557
[45] Date of Patent: Aug. 22, 1989

[54] EPITAXIAL REACTORS

[75] Inventors: Vittorio Pozzetti, Brugherio; Piergiovanni Poggi; Franco Preti, both of Milan, all of Italy

[73] Assignee: L.P.E. Spa, Milan, Italy

[21] Appl. No.: 73,483

[22] Filed: Jul. 15, 1987

Related U.S. Application Data

[63] Continuation-in-part of Ser. No. 756,084, Jul. 17, 1985, abandoned.

[30] Foreign Application Priority Data

Jul. 19, 1984 [IT] Italy .................... 21960 A/84
Apr. 24, 1987 [IT] Italy .................... 20255 A/87

[51] Int. Cl.$^4$ .................... C23C 16/46; C23C 16/52
[52] U.S. Cl. .................... 118/725; 118/730; 219/10.51; 219/10.77
[58] Field of Search .............. 118/725, 730, 500, 724; 219/10.49 R, 10.67, 10.75, 10.77, 10.491, 10.51

[56] References Cited

U.S. PATENT DOCUMENTS

| | | | |
|---|---|---|---|
| 3,330,251 | 7/1967 | Gutsche | 118/725 |
| 3,645,230 | 2/1972 | Hugle et al. | 118/730 |
| 3,699,298 | 10/1972 | Briody | 219/10.49 |
| 3,749,383 | 7/1973 | Voigt et al. | 118/729 X |
| 4,217,856 | 8/1980 | Kraus | 118/724 |
| 4,284,867 | 8/1981 | Hill et al. | 219/10.75 |
| 4,496,828 | 1/1985 | Kusmierz et al. | 118/50.1 |
| 4,550,245 | 10/1985 | Arai et al. | 118/724 X |
| 4,579,080 | 4/1986 | Martin et al. | 118/500 |

FOREIGN PATENT DOCUMENTS 1924997 11/1970 Fed. Rep. of Germany ... 219/10.49

Primary Examiner—Evan Lawrence
Attorney, Agent, or Firm—Cushman, Darby & Cushman

[57] ABSTRACT

A reactor for chemical vapor deposition of epitaxial layers on crystalline substrates uses a medium frequency heating system, the power for the heating being provided by a multi-turn coil, inducing electrical currents in a susceptor of electrically conductive material, such as graphite, housed in a transparent bell jar. The internal sides of the turns of the coil are optically finished to reflect back heat to the susceptor irradiated therefrom during operation. Heating is controlled by substracting or adding reactive currents from or to different turns of the coil and through properly shaping the walls of the susceptor in order to control temperature gradients therein.

27 Claims, 5 Drawing Sheets

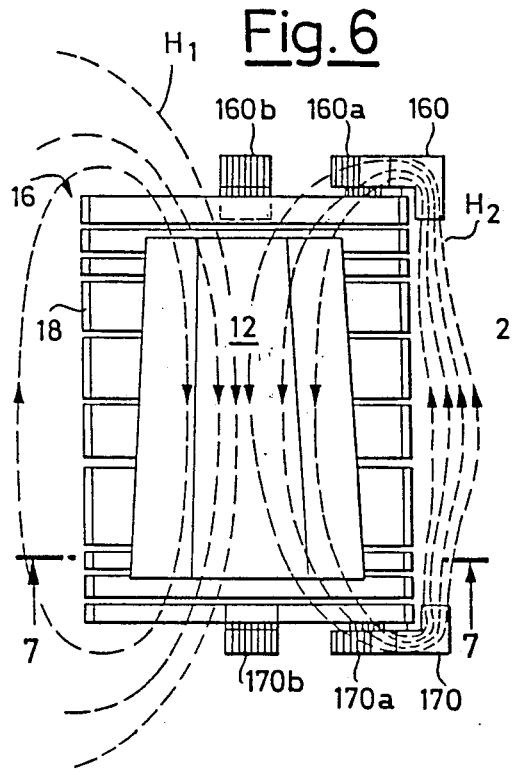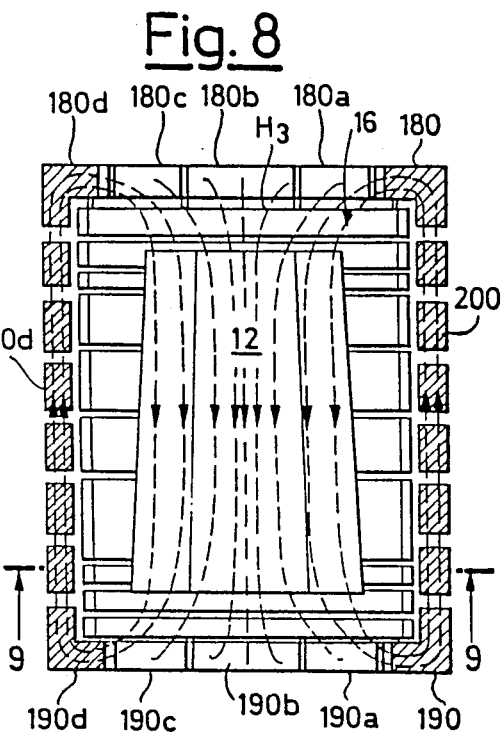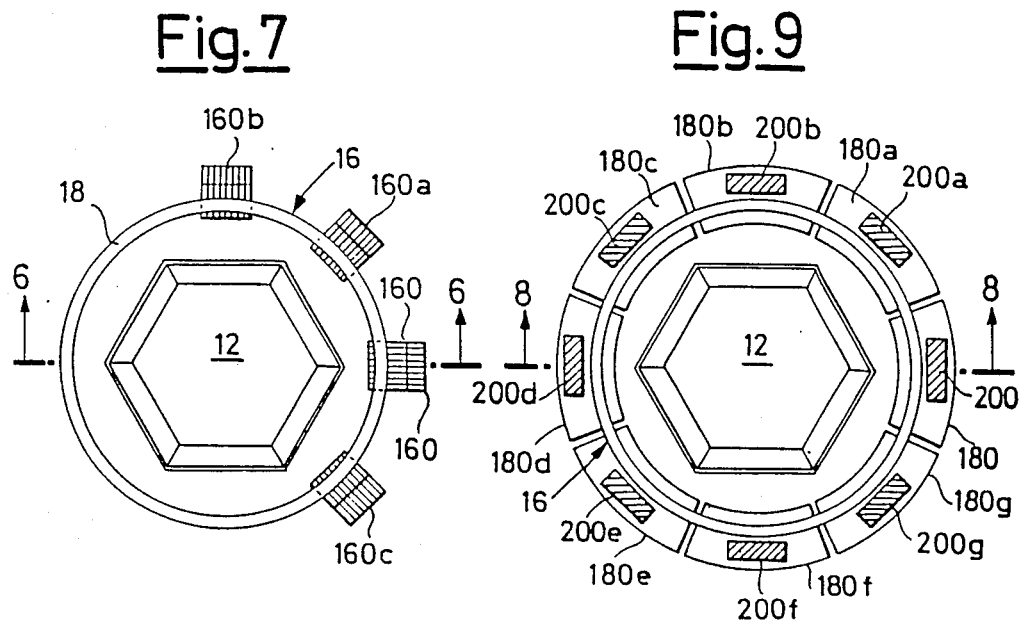

EPITAXIAL REACTORS

This a continuation-in-part of application Ser. No. 756,084, filed July 17, 1985, now abandoned.

BACKGROUND OF THE INVENTION

The present invention relates to epitaxial reactors, i.e. apparatuses in which substrates or wafers of various materials are covered through epitaxial growth by means of vapor phase chemical deposition, as disclosed for example by the U.S. Pat. No. 3,749,383 Voigt et al. The invention relates in particular to epitaxial deposition of monocrystal silicon on silicon substrates or wafers for the fabrication of semiconductor devices. Epitaxial growth on silicon wafers or substrates is a process which takes place at temperatures between 900° C. and 1250° C. in flowing hydrogen and other gases (e.g. $SiCl_4$ or $SiHCl_3$) using a graphite susceptor covered with gas-proof coatings which do not react with them. The coatings typically consist of silicon carbide on which are set the substrates of wafers. Growth takes place on the face of the substrates in contact with the gas.

The susceptor has a truncated pyramid shape and is enclosed in a slightly larger quartz bell jar transparent to wavelengths of about 1 micron in which the gases may flow. The susceptor of the kind disclosed in U.S. Pat. No. 3,749,383 rotates around its vertical axis to obtain a uniform temperature and distribution of the reaction gases. To bring the susceptor to the required temperature and hold it there during the growth process (20–90 minutes) electromagnetic induction is used with a specifical generator and an oscillatory circuit including capacitors and an inductor provided by a coiled electrical conductor hereinafter called a coil, would externally around the quartz bell jar and coaxial with the susceptor.

The crystallographic defects of the product (typically silicon wafers) are related to the transverse temperature gradient from the back to the front of the substrate which brings on cup-like warping of the substrate due to the expansion differential between the front and the back of the substrate, inducing stresses in the crystal lattice which in some points exceed the elasticity limit. This causes slipping of the crystallographic planes. The lines of slippage and dislocation remain after cooling and constitute zones where the proper working of the semiconductor is distorted, lowering the yield of the product. With an induction heating system the temperature gradient cannot be completely eliminated but, to improve the product quality it is advisable to minimize the gradient by creating an isothermal optical cavity, i.e. reflecting on the susceptor and on the wafers as much as possible of the energy radiated by them.

There were in the prior art some attempts to use substantially cylindrical mirrors in order to reflect back on a susceptor, or similar body, heated by induction, the thermal energy irradiated by it (see for example the German published patent application No. 1,924,997 and U.S. Pat. No. 3,699,298. However, the reflecting lining 5 of German published patent application No. 1,924,997, working as a short circuited turn inside the induction coil 3, dissipates as heat part of the radio frequency power supplied by the coil 3 and, not having any efficient heat sink to dissipate the so formed heat, can properly work only at very limited power levels (at most of the order of one or two kilowatts). Such a reflection would be destroyed, through overheating and melting, by power levels between 70 and 150 kilowatts, as provided by the present invention.

The Faraday shield 42 mentioned in U.S. Pat. No. 3,699,298 works as a short circuited turn also and can stand the dissipated high power level owing to efficient water cooling but must face all the problems connected with an excessive power dissipation typical of the prior art.

U.S. Pat. No. 4,284,867 partially solves this problem by using a half cylindrical mirror properly divided into two separated quadrants to avoid the problem of the radio frequency energy dissipation through induction in the mirrors, but, unfortunately the mirror surrounds just the half of a susceptor, introducing some dissymmetry in the reflected thermal energy, thereby enhancing the temperature gradients to be most avoided.

It should be noted that for a larger diameter of the silicon wafer there is a correspondly greater sensitivity to crystallographic defects which is fatal for the yield of the product. At the same time the trend in the semiconductor industry is toward ever larger diameters (from a diameter of 75 mm (3″) in 1979 to a diameter of 125 mm (5″) in 1983 with an expected diameter between 150 mm and 200 mm (between 6″ and 8″) in the nineteen-eighties).

The main object of the present invention is to provide a system capable of reflecting the thermal energy radiated by the susceptor on to the susceptor itself and on the substrates without substantially absorbing electromagnetic energy from the inductor, with a resulting lower absorption of electrical power under steady operating conditions, and to reduce the transverse temperature gradient on the silicon substrates.

These objects are achieved with an epitaxial reactor of the type comprising at least one quartz bell jar in which is mounted a graphite susceptor covered with a coating of appropriate known materials (such as silicon carbide) on which are accommodated the substrates of wafers to be treated, said susceptor, being able to rotate around its vertical axis, said bell jar being fed with a mixture of gases of appropriate known composition (e.g. hydrogen saturated with $SiCl_4$ or $SiHCl_3$). The susceptor is heated by electromagnetic induction produced by a generator and an oscillatory circuit comprising capacitors and an inductor consisting of a coil or solenoid, wound externally around the quartz bell jar and coaxial with the susceptor, wherein the generator consists of a static converter operating at medium frequency (between 1 kHz and 20 kHz), and around said quartz bell jar is arranged a screen, having a cylindrical shape, capable of returning to the susceptor the energy radiated by the same. The screen is made of material capable of reflecting the wavelengths of the peak emissivity of the susceptor and is capable of the lowest coupling with the electromagnetic field of the inductor depending on the frequency of oscillation in order to have a minimum power dissipation therein.

It should be noted that among the many epitaxial reactors which historically became popular in the semiconductor industry, one that distinguishes itself by excellent features is disclosed in U.S. Pat. No. 4,579,080. That apparatus uses a susceptor having a multi-face prismatic or truncated pyramidal shape, enclosed in an insulating bell jar non-reactive in respect of the chemical vapors inside said bell jar, the bell jar being covered by a reflective layer, such as a metallic layer, to reflect the thermal energy irradiated by said susceptor during operation, in order to reduce the power consumption and to render the temperature of said susceptor uniform. The bell jar is surrounded by a cooling liner cooled by a liquid, such as water, to hold the walls of said bell jar to such a temperature as to prevent a substantial deposition on said walls of material potentially contaminating to the substrates treated in the reactor. As further disclosed in the patent the bell jar is surrounded by an inductor or coil energized by medium-frequency alternating current (between 1 and 15 kHz) to provide power to heat said susceptor, the inductor or coil being formed by a conductor wound in many turns properly spaced by provide to said susceptor a power variable from a point to another, as particularly specified at column 12, lines 59, 67 of the patent. If the local power in the susceptor must be changed, the spacing between adjacent turns must be varied through control means controlling the turn spacing, which control means have various mechanical and spacing range problems associated with the dimensions of the conductors. Moreover, where the turn spacing is large, the conductors forming the coil will lie in planes which are no longer perpendicular in respect of the susceptor axis and, as a consequence, the electrical current which is induced parallel to the turns results in local heating producing the same substantial thermal gradient. Owing to the susceptor rotation, the thermal gradient produces a local pulsating heating, thereby enhancing those thermal gradients which are sought to be reduced, with the consequent production of crystal defects or flaws in the substrates or wafers.

Further the susceptor has thickens or projections in some regions, such as regions around pockets or indentations housing the substrates or wafer to be heated (see column 8, lines 50–55), and has thinning at some other regions as the dihedral corners and upper and lower regions (see column 13, line 66 to column 14, lines 14), for the purpose of distributing the heat according to desired patterns.

However, such patterns required a tedious and time-consuming empirical process to determine the shape giving the best thermal results and producing more uniform temperature profiles across the faces of the sidewalls of the susceptor.

Lastly, it is asserted in the patent that, owing to the heat irradiated by the susceptor and to the heat produced by induced currents within the reflecting metallic layer lining the quartz bell jar, it is very difficult to obtain efficient air cooling and, as a consequence, it is preferred to use water cooling provided by a water liner surrounding said bell jar (see column 11, line 57 to column 12, line 17).

SUMMARY OF THE INVENTION

The present invention provides a remedy for the above-listed problems, by using a quartz bell jar without any reflecting layer or liquid cooling liner and by using, for the reflecting function, the internal regions of the conductors making up the inductor or coil, the latter being manufactured with proper reflecting features. This system, not having a reflecting layer on the bell jar walls, reduces bell jar heating, thereby avoiding any induced current in a reflecting layer. Moreover, as the conductors of the coil are hollow, with water flowing therethrough, they cool the reflective regions of the coil (reflector) so efficiently that it is possible to use cooling air. Preferably, to make the air cooling particularly efficient, a system is provided comprising a fan or blower, compressing air within a chamber completely surrounding the inductor or coil, which air is then discharged through a directing blade assembly or nozzle forming a swirling stream rising from the base to the tope of the quartz bell jar, the air being conveyed between the bell jar and the surrounding an air-water heat exchanger, similar to a car radiator, with the blower input.

More preferably, the air, in order to further contact the bell jar walls at the base, is introduced through suitable gaps, due to the spacing between adjacent turns of the coil adding to the air flow, and then travels around the bell jar, effecting further cooling by passing around the coil conductors, which are hollow and liquid cooled.

However, this system, having specifically the great advantage of using a coil formed by ring shaped conducting turns lying on planes substantially perpendicular to the susceptor axis inducing in said susceptor electrical currents perpendicular to said axis in order to avoid the above mentioned pulsating heating connected with the susceptor rotation, has the serious problem of requiring an inductor, with rather closed turns, in order to reduce the discontinuities in the reflector around the bell jar, and a fixed shape, so that it is not possible to move turns in order to change locally the electromagnetic field and the power induced in the susceptor.

However, it has been found that it is possible to change locally the magnetic field by changing locally the electrical current in any individual turn of the coil through proper taps connected to non-dissipating or reactive controllable circuits which can be inductive, capacitive or both in the nature according to specific needs.

Specifically, if it is desired to reduce the current through some turns, an inductive circuit is shunt-connected to said turns, while if it is desired to increase said current, a capacitive circuit is shunt connected. Preferably, the inductive circuit can be made variable by either connecting or disconnecting some of its turns, or introducing therein and extracting therefrom a ferromagnetic core of the kind suitable for the working frequencies.

The capacitive circuit can be made variable by using many capacitors shunt connectable through connecting plugs, or hand or electrically controllable switches.

A circuit can be provided by a combination of many inductors and capacitors parallel or series connected among them. Specifically, it is possible to have a variable circuit having both inductive and capacitive features, by combining together a continuously variable inductor with selectively connected discrete capacitors, the inductor and capacitor assembly so formed permitting a family of current withdrawing and admitting features out and into the turns of the coil heating the susceptor.

According to an alternative solution, the coil reflector assembly is formed by metallic sheet cylindrical surfaces, cut along a generatrix line, any one of them being surrounded by at least a hollow liquid-cooled conductor welded or soldered against it, the height of said surfaces changing according to the spaces between adjacent turns of the coil and the conductive being series connected between them through bridges permitting the formation of a coil from adjacent turns, lying on planes perpendicular in respect of the axis of said susceptor.

According to a preferred embodiment, in order to limit the magnetic field dispersion outside the coil, angularly shaped blocks are provided surrounding the top and the lower edges of the coil and comprising a ferromagnetic material chosen according to the field provided by the coil and the frequency of energizing current thereof.

According to a preferred embodiment, the angularly shaped ferromagnetic blocks are connected by cylindrical shells surrounding the coil.

According to another preferred embodiment, the angularly shaped ferromagnetic blocks are connected to each other by columns of ferromagnetic material, separated and surrounding the coil only partially.

According to a further embodiment of the present invention the susceptor has at its lateral corners, bevellings larger outside then inside to keep constant or reduce its thickness in these regions and further some thickness reduction in the walls under the pockets housing the waters to be treated.

Specifically, these reductions can have the shape of a circular, planar bottom depression, of a circular bevelled bottom depression, or of a generally conical relief from the center to the periphery of said pockets. Further, as the pyramidal shape of the susceptor, embracing a magnetic flux, decreasing from the basis to the top, produces a reduction in the induced power, said reduction can be compensated reducing proportionally the whole thickness of the susceptor in order to maintain a constant current density therein.

BRIEF DESCRIPTION OF THE DRAWINGS

The features and the advantages of the present invention, together with other objects thereof, will be clear from the following detailed description of an embodiment thereof, given by way of example and for non-limiting purposes, taken with the drawings, in which:

FIG. 6 is an axial sectional view of a coil and susceptor assembly provided at the ends with angularly shaped blocks of ferromagnetic material to reduce the electromagnetic field dispersion outside the coil;

FIG. 7 is a view along line 7—7 of FIG. 6;

FIG. 8 is an axial sectional view of the coil and susceptor assembly provided with a whole ferromagnetic shell to reduce the dispersion of electromagnetical fields;

FIG. 9 is a view along line 9—9 of FIG. 8;

Referring to FIG. 1, it is seen that an epitaxial reactor 10, according to the present invention, includes a susceptor 12 rotatable and introducible in an insulated, transparent bell jar 14, usually a quartz bell jar. Said bell jar 14 is surrounded by a coil 16 formed by many turns 18 shaped as planar rings, open on a side and connected to each other by conducting bridges or jumpers 20, providing the electrical connection between adjacent turns. The turns are essentially formed by a hollow conductor, such as rectangular pipe, through which travels a cooling liquid, such as water, the water being maintained at appropriate work temperatures, consistent with the proper reactor working. Specifically, the hollow conductors, formed by the turns 18 of the coil 16, have different heights according to their position in the coil, being lower at the ends of the coil 16 and higher in an intermediate region thereof in order to permit higher current densities and thus higher heating power, in the end regions of the susceptor 12 and lower densities in the intermediate regions thereof.

Figure 1:
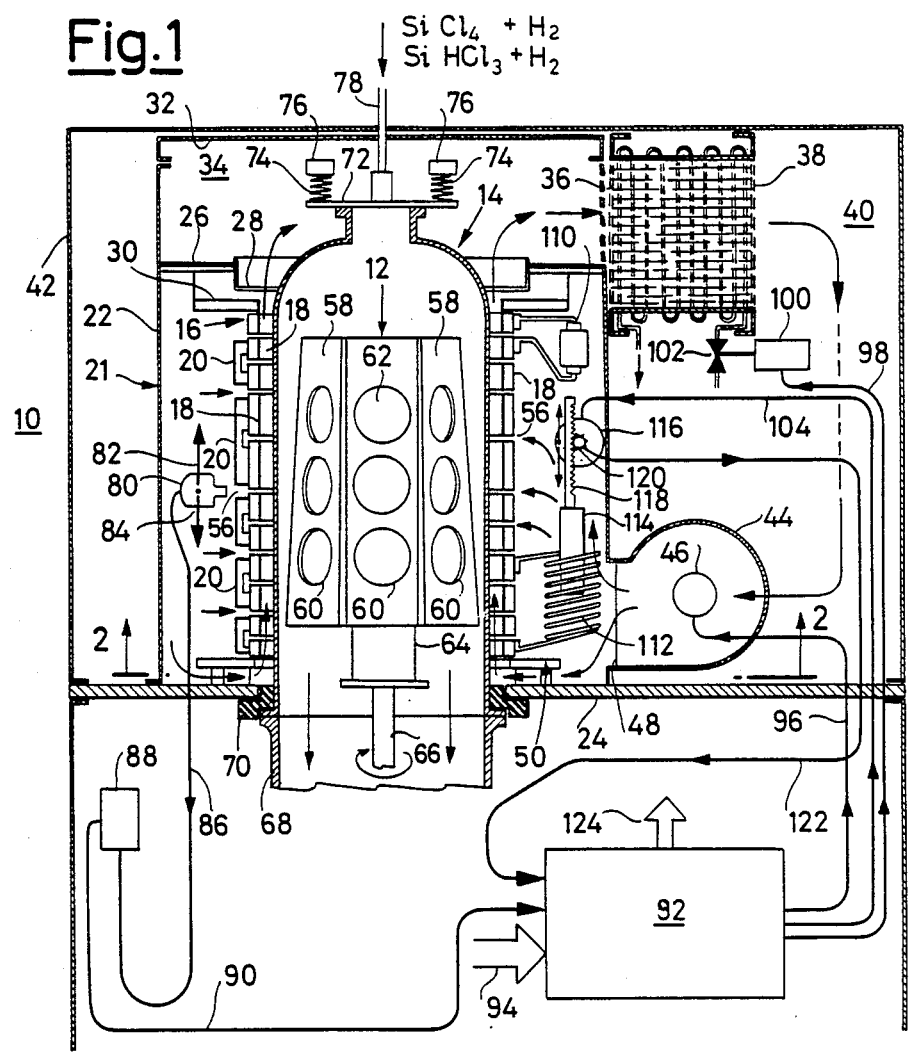
FIG. 1 is a diagrammatical sectional view of an epitaxial reactor provided with improvements according to the present invention.
Figure 2:
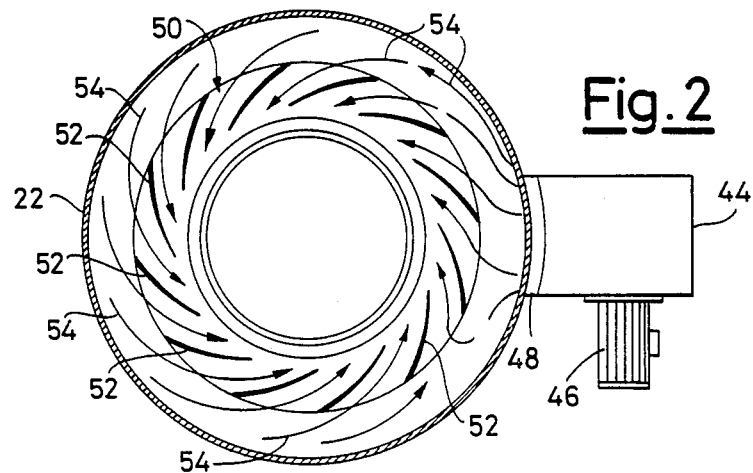
FIG. 2 is a view, taken along the line 2—2 of FIG. 1 specifically depicting an air swirling and distributing system according to the present invention.

The inductor 16 and bell jar 14 assembly is enclosed in a pressurizing chamber 21 formed by a cylindrical wall 22 abutting on a lower plane 24 and a top closed by a dividing plane 26, provided with a structure 28 containing said bell jar 14 and with a structure 30 sustaining the coil 16. An upper cover 32 defines an upper chamber 34 communicating through a window 36 with an air-water heat exchanger 38 in its turn connected with an external chamber 40 defined by an external metallic compartment 42, abutting on the plane 24, and enclosing the whole air circuit surrounding the bell jar 14. A blower 44, actuated by a motor 46, takes air in from the external chamber 40, admitting it to the pressurizing chamber 21, through an opening 48. From here the air passes in contact with the bell jar 14 through a swirl generating nozzle 50, provided with deflecting and conveying blades 52, providing the air with a swirling movement, evidenced by arrows 54 (see specifically FIG. 2). In addition to passing through the nozzle 50, the cooling air can pass through the separating gaps 56 between the single turns 18 of the coil 16, enhancing the turbulence which helps the heat removal from the walls of the quartz bell jar 14. The gaps 56 can be also provided with opening regulating iris diaphragms to affect the air flux through them and thus the wall temperature of the bell jar 14.

The susceptor 12 has the shape of truncated pyramid with a polygonal base (hexagonal in this example) and is provided with a plurality of faces 58 in which are cut pockets or indentations 60 which have wafers or slices 62 of material to be treated, such as the typical silicon wafers. The susceptor 12, held by a support 64, is rotated by a shaft 66 passing through a suitable sealing support and actuated by a motor (not shown), said support being integral with a pushing support 68 abutting against the lower base of the bell jar 14. The pushing support keeps the bell jar pushed against a gasket 70 located between the bell jar base and the lower plane 24 and against a sealing pierced plate 72, pushed by springs 74 abutting against supports 76, permitting to introduce through a pipe 78 the gases to be used in the epitaxial reactor, as for example, $SiCl_4$, $SiHCl_3$, $H_2$ and other gaseous components, such as aluminum and phosphor compounds, to assure the proper silicon doping.

The temperature of the susceptor 12, during working of the reactor is detected by at least one optical pyrometer 80, movable according to the arrows 82 and 84, so as to survey the susceptor 12 through the gaps 56 between the turns 18 of the coils 16. The pyrometer 80 is connected through a cable 86 to a first processing center 88, as for example an analog to digital converter (A/D) which through a cable 90 sends temperature data to a central processor 92. The processor 92 receives through a multiple bus 94 all the directions and data for the managing of the whole epitaxial reactor and emits regulating signals, for example, a first signal through a line 96, to control the speed of the motor actuating the blower 44, a second signal through a line 98 for an actuator 100 of a flux regulating valve 102 to regulate the cooling water flux in the air-water heat exchanger and a third signal through a line 104 for the current control in single turns of the coil 16 according to a system hereinafter disclosed.

Alternatively, instead of a single movable pyrometer 80, a plurality of optical pyrometers can be used, suitably positioned in many suitably surveying points and by turn connectable to the above-mentioned first processing center 88 through one of many electronic switching circuits widely diffused and well-known in the present information processing art.

As already stated, it is possible to locally vary the current in specific turns of the coil 16, shunt connecting then to capacitors such as the capacitor 110, or to inductors such as the inductor 112. The inductor 112 can be variated by the use of cores, such as the ferromagnetic core 114 introducible in or withdrawable from the inductor through an actuator 116, such as a motor acting on the racked rod 118 connected to said ferromagnetic core 114. Said ferromagnetic core can be formed by a stack of laminations particularly thin and well insulated, suitable for the frequencies (1 kHz to 20 kHz) of the current energizing the inductor 16. The core can be also be formed by a cylindrical ceramic ferrite rod having high magnetic permeability and high magnetic fields, of the kind used in transformers for voltage converters controlled by semiconductor devices.

The racked rod 118, moved by the actuator 116, is also provided with a position transducer 120, having the function of informing the central processor 92, through a line 122, about the position of the core 114 within the turns of the inductor 112.

Figure 3A:
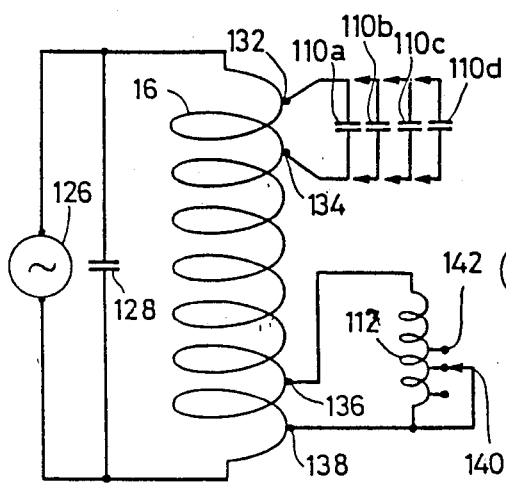
FIGS. 3a, 3b, 3c and 3d depict different kinds of reactive circuits differently regulable to control the current in the individual turns of the coil.
Figure 3D:
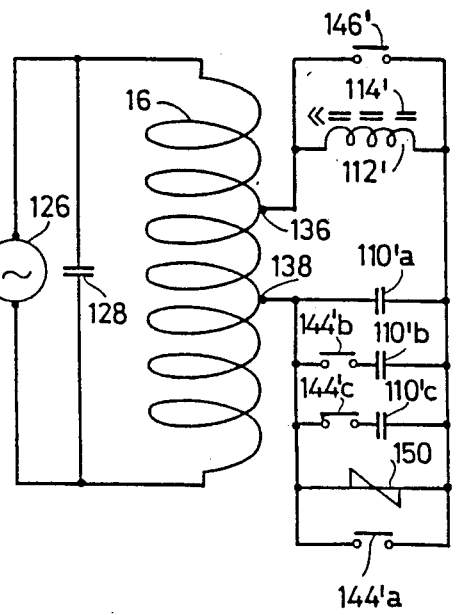
Figure 3B:
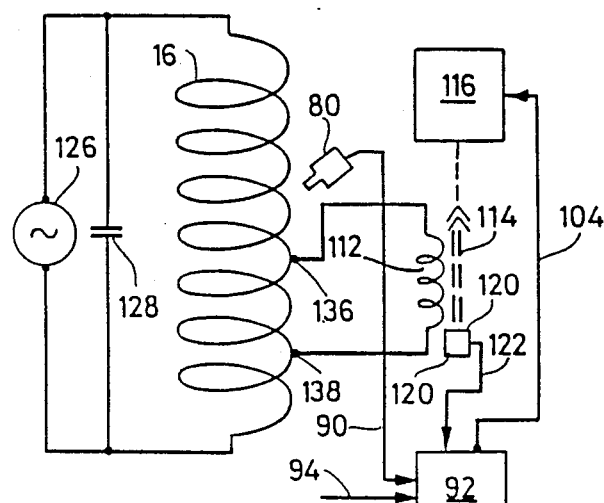
Figure 3C:
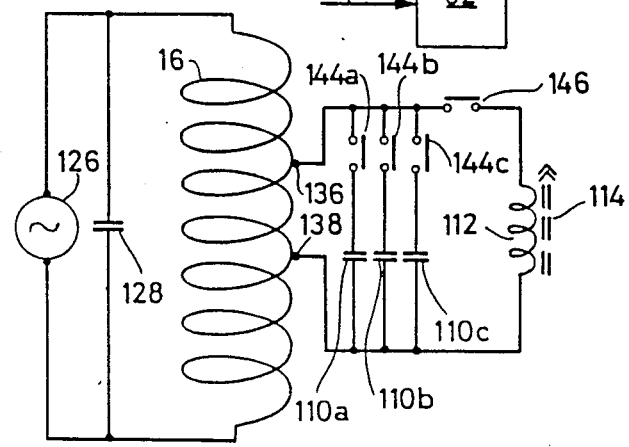
Figure 4:
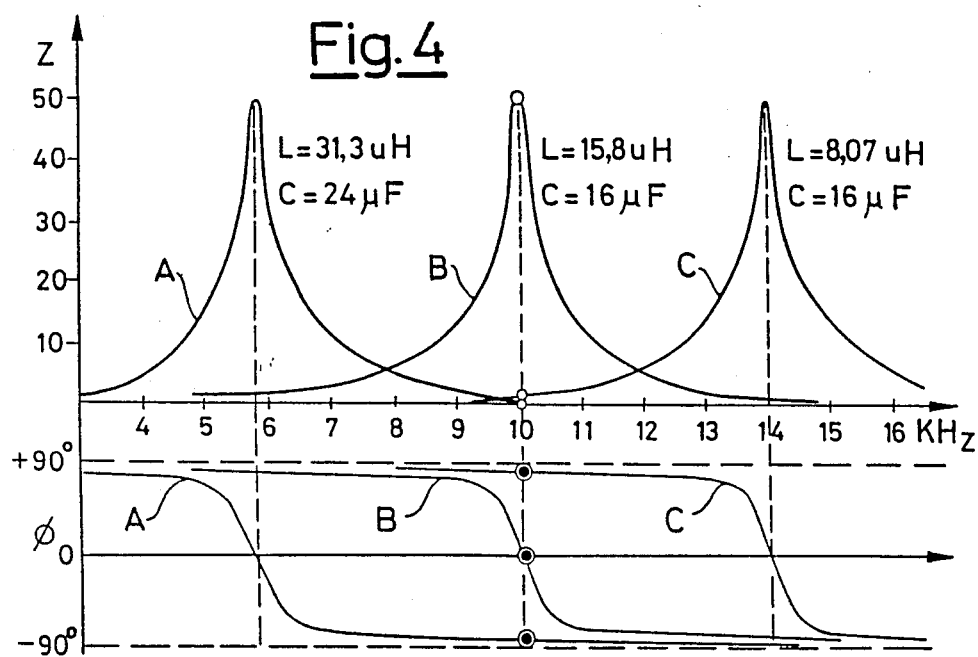
FIG. 4 depicts the impedance and phase features of a reactive circuit according to FIG. 3c.
Figure 5:
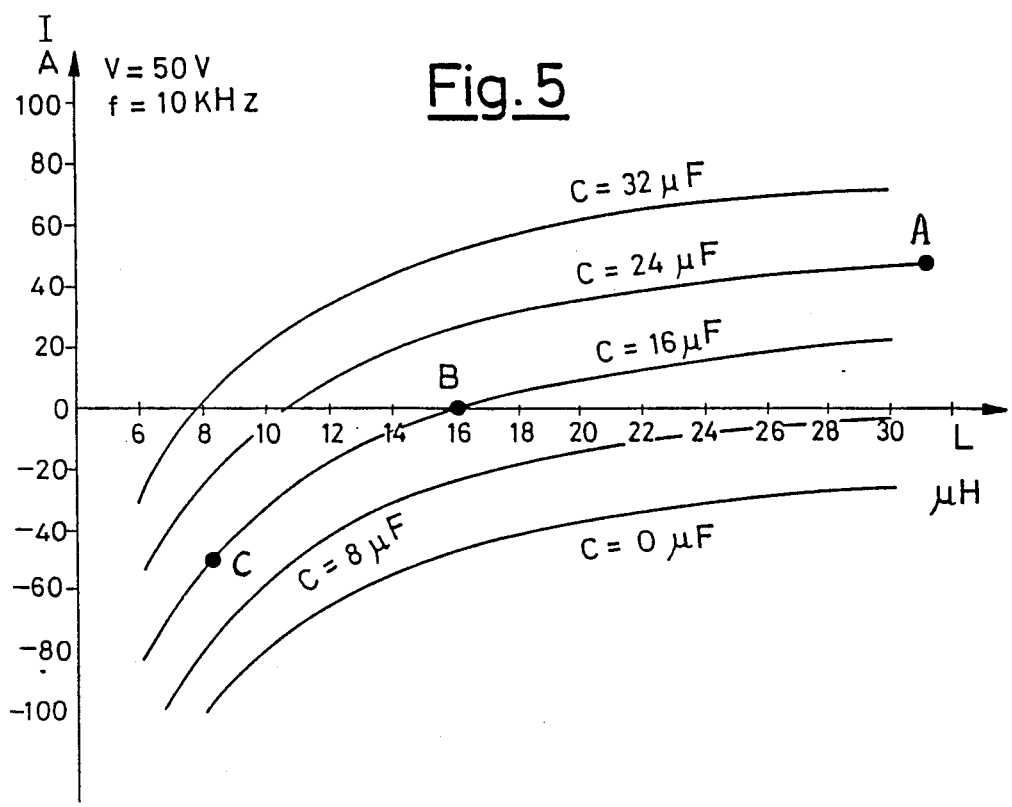
FIG. 5 depicts the current absorbed from or provided to a coil by a reactive circuit according to FIG. 3c, in accordance with various inductance and capacity values.

The possibility of controlling the current locally in specific turns of the coil 16 in order to control the electromagnetic field locally and thus the power induced in the susceptor 12, can be better understood by referring to FIGS. 3, 4 and 5.

Reference is made to the simpler case in FIG. 3a. A coil 16 is fed by an alternating current generator, indicated by the numeral 126, and resonates at the frequency of the generator 126 by means of a shunt connected capacitor 128 duly shaped to produce a resonance.

If taps at indicated turns of the coil 16 are considered, said taps permit the coil 16 to work as an autotransformer and if reactive loads are connected to said taps, it is possible to derivate a current between a pair of said taps.

Due to the fact that the reactive load is inductive or capacitive in nature, the current derived between said two taps is subtracted from or added to the current in the coil turns. According to the example depicted in the FIG. 3a, between the tap pair 132 and 134 can be connected capacitors 110a, 110b, 110c etc, in order to obtain selectable current increases between said tap pair. Owing to the very high current crossing the water cooled capacitors, it is preferable that the connections to said capacitors are hand performed by means of proper connectors through the help of suitable tools used to move fastening screws or bolts.

In a like way between the tap pair 136 and 138 of the same coil 16 is connected a load inductor 112, provided with a short circuit conductor 140, consisting for example of a plate connectable by means of bolts between taps 142 of adjacent turns of said load inductor 112. This kind of control can be hand controlled and can produce preselected fixed regulations of the current in the coil 16. Moreover, to perform said regulations, the power to the coil 16 must be disconnected, and as a consequence, the work and production of the reactor must be shut-down.

In order to have a continuous and automated regulation of current, derived for example between the tap pair 136 and 138, the assembly in FIG. 3b is used. In this figure the inductance of the inductor 112, connected between the taps 136 and 138, is varied by moving a ferromagnetic core 114 in and out of said inductor, said core being moved by an actuator 116 controlled through a line 104 by the central processor 92, the latter receiving from a line 90 signals coming from an optical pyrometer 80 and from a line 122. The pyrometer measures the susceptor temperature and thus the local power density associated with the current in individual coil turns. The line 122 supplies position data produced by a transducer 120 relating to the core 114 position within the inductor 112. The above mentioned device is capable of varying continuously, controllably and automatically the current derived between the taps 136 and 138 of the coil 16.

A further improvement of the reactive load circuit of the coil 16 depicted in FIG. 3c, consists in a combination of many capacitors 110a, 110b, 110c, connectable between the taps 136 and 138, possibly shunting the inductor 112 variable by means of the movable ferromagnetic core 114. A switch or relay contact assembly 144a, 144b, ... and 146 permits the shunt connection of one more capacitors and/or the variable inductor 112. What is obtained is a parallel resonant circuit which, by varying its constants (i.e. inductance and/or capacitance) resonates to frequencies higher or lower with respect to the generator 126 frequency giving the reactive circuit either inductive or capacitive features, respectively, and permitting through the simple variation of the inductor 122, to continuously change the features of said circuit from capacitive to inductive and vice versa, permitting a particular versability of the coil 16.

The specifical working of said reactive circuit will be explained with reference to the diagrams of FIGS. 4 and 5.

A further reactive circuit also having variable inductive and capacitive features is that depicted in FIG. 3d. In this circuit there are capacitors 110a, 110b, 110c ... shunt connectable to each other and successively series connected with a variable inductor 112' provided with a movable core 114'. This reactive circuit is actually a series resonant circuit which, by variating its constants, can resonate at frequencies lower or higher with respect to the frequency of the generator 126, giving the reactive circuit capacitive or inductive features, respectively. Switches or relay contacts 114'b, 114'c, permit shunt connection of the capacitors 110'b, 110'c, in respect of the capacitors 110'a, while a further switch or relay contact 114'a short circuits all the capacitors 110'a, to 110'c. A further switch or relay contact 146', can short circuit the inductor 112'. This reactive circuit, formed by a series connected resonant circuit can work equivalently to the parallel resonant circuit, having however the drawback that near the resonance frequency the circuit could develop too high a currents. Further, across the reactive members can develop such high voltages as to suggest the provision, at least across the capacitors 110'a to 110'c, of a voltage limiting member 150, such as a voltage dependent resistor (VDR) or varistor, to protect them against such overvoltages.

For a full understanding of the working of the FIG. 3c circuit, which is the most preferred, reference is now made to FIGS. 4 and 5, depicting impedance and phase angle, between voltage and current diagrams, for different inductance and capacity combinations and diagrams for currents added to or subtracted from the coil 16 for different capacitors against a continuous inductance variation.

According to the curves A, a circuit having a 31.3 microhenries inductance and a 24 microfarads capacity resonating at the 5.75 kHz frequency, behaves at the 10 kHz frequency as an almost pure capacitor, having of course lesser capacity. According to the curves B, a circuit having a 15.8 microhenries inductance and a 16 microfarads capacity, resonating exacting at 10 kHz, behaves as a pure resistor, while according to the curves C a circuit having a 8.07 microhenries inductance and 16 microfarads capacity, resonating at 14 kHz, behaves at the 10 kHz frequency, as an almost pure inductor, having of course lesser inductance.

FIG. 5 clearly depicts how, by variating the inductor 112 for a given capacity of the capacitors 110, it is possible to go from a current subtracted from the turns of the coil 16 to a current added or introduced in said turns. For example, the first diagram marked out for a 32 microfarads capacity, shows that with a 6 microhenries inductance the reactive circuit subtracts a 30 amperes current from the turns of coil 16 on which a 50 volts voltage is formed (this, of course, at 10 kHz frequency), while with a 30 microhenries inductance, the circuit adds to said turns about 70 amperes current with the current being substantially zeroed for a 8 microhenries inductance at which there is the 10 kHz resonance.

With a 24 microfarads capacity and a 6 microhenries inductance, the circuit subtracts a 55 amperes current from, and with a 30 microhenries inductance introduces a current of about 45 amperes in the coil 16, said current being substantially zeroed at the resonance condition at 10 kHz provided by an about 10.5 microhenries inductance. The remaining diagrams can be understood in a similar way; by lowering the capacity with the same inductance the current subtracted from the coil 16 is increased, while the current admitted to the coil 16 is decreased.

Reference is now made to FIGS. 6 and 7 in which is depicted a first assembly to reduce the dispersion of the magnetic field produced by the coil 16, outside the same. Said dispersion reduction is obtained by providing angularly shaped blocks 160, 160a, 160b, . . . and 170, 170a, 170b, of ferromagnetic material near the upper and the lower edge of the coil 16. Said blocks, made for example of very think silicon-steel laminations, to take into account the working frequency, guide the ferromagnetic field, reshaping it from the highly dispersed form indicated by the symbol $H_1$ to the more concentrated and near the coil 16 form indicated by the symbol $H_2$. It is evident that outside the coil 16 the field $H_2$ reduces itself faster than the field $H_1$. strongly reducing the heating of metallic components which can be immersed in said field. However, the lesser heating of said metallic components finds a negative counterbalance in the heating of the blocks 160–170 which, because of the high power, can require a water cooling thereof.

The last mentioned drawback can be much reduced by replacing the lamination blocks 160–170, depicted in FIGS. 6 and 7, with blocks 180–190, depicted in FIGS. 8 and 9, of magnetic material which has low electrical conductance, such as the well known ceramic ferrites which, moreover, have very little power losses at the working frequencies. Further considering FIGS. 8 and 9, it is seen that blocks 180, 180a, 180g surround the top edge of the coil 16 and the blocks 190, 190a, 190d, etc, surround the bottom edge of the same coil 16. This arrangement permits the shaping of a magnetic field $H_3$ between the inside of the coil 16 and external paths formed by said blocks 180, 180a, 180g, and 190, 190a–190g, and by columns 200–200g connecting the above mentioned blocks in order to reduce at the minimum the magnetic field dispersion outside the coil 16.

Figure 10A:
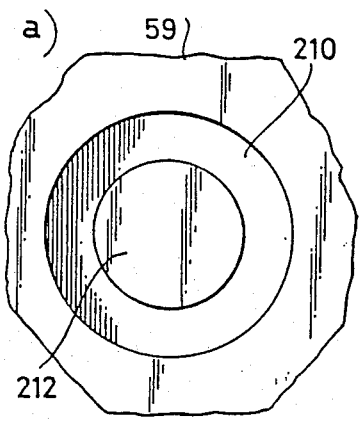
FIGS. 10a, 10b and 10c are back, cross-sectional and front views, respectively, of a part of a susceptor provided with a depression having shape of a circular planar trench.
Figure 10B:
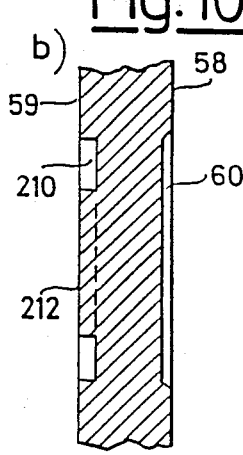
Figure 10C:
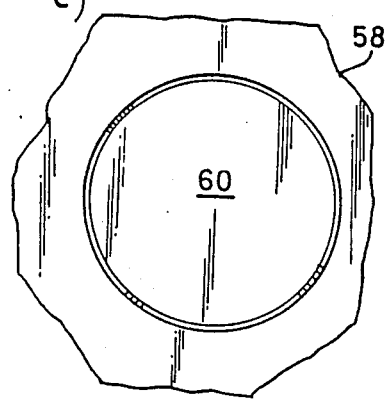
Figure 11A:
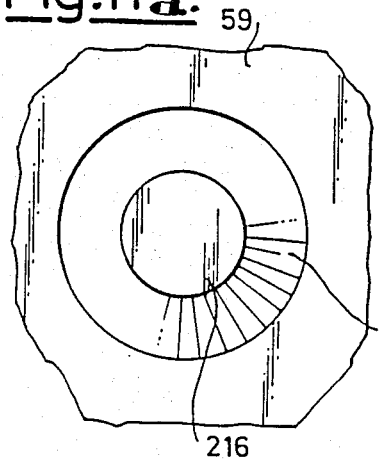
FIGS. 11a, 11b and 11c are back, cross-sectional and front views, respectively, of a part of susceptor provided with a depression having shape of a circular trench outside bevelled.
Figure 11B:
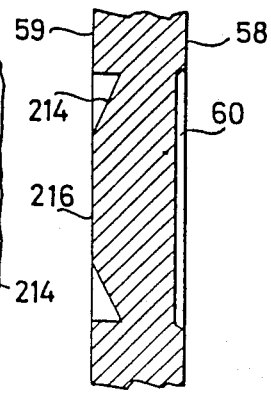
Figure 11C:
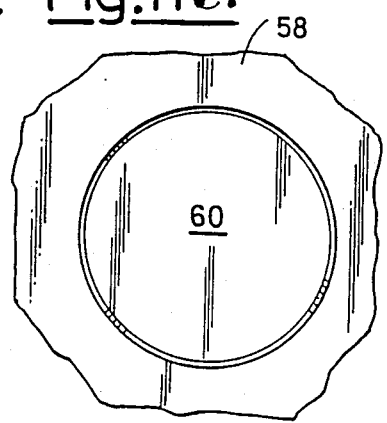
Figure 12A:
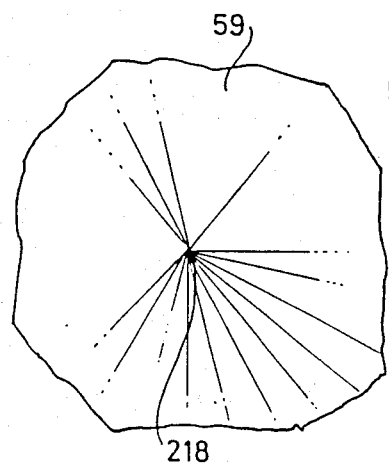
FIGS. 12a, 12b and 12c are back, cross-sectional and front views, respectively, of a susceptor provided with a generally conical relief.
Figure 12B:
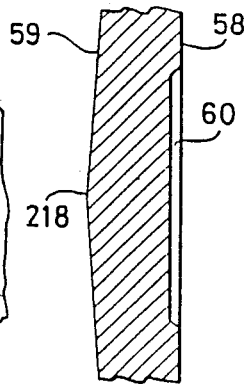
Figure 12C:
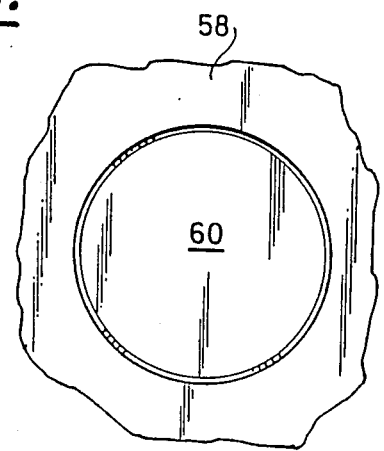

In order to assure specific heating profiles to the indentations or pockets 60 on the faces 58 of the susceptor 12, there can be used specific shapes for the internal faces 59 of the susceptor 12, aligned with said pockets 60, as depicted in FIGS. 10, 11 and 12. Particularly in FIG. 10 behind the pocket 60 there is provided a depression 210, having the shape of the remaining face 59. In FIG. 11, behind the pocket 60, there is provided a bevelled depression 214 having the shape of a circular corona, gradually rising from the external to the internal circumference, to reach a planar area 216 at the same level of the face 59. In FIG. 12, behind the pocket 60, there is provided a continuous relief, similar to a conical surface, having a top in a vertex 218 substantially aligned with the center of the pocket 60.

Each of these indentation or relieves depicted in FIGS. 10, 11 and 12 produces in the pockets 60 temperature profiles obvious to people skilled in the art, having in mind that to a lesser susceptor thickness corresponds higher temperature in the susceptor and thus in the wafer accommodated in said pockets 60.

A further measure to be taken is to provide the lateral corners of the susceptor 12 with bevellings larger outside than inside in order to maintain constant or reduce locally the susceptor thickness and thus maintain constant or increase locally the current density therein.

In the present specification have been depicted as an example, improvements to coils and susceptors of epitaxial reactors permitting them a particularly proper working required for treating wafers accommodated in the pockets 60 of the susceptors 12.

Obviously, a person skilled in the art will be able to determine approaches and measures wholly or partially equivalent to those described in the present specification, and it is here intended to cover all said equivalent measures and approaches falling in the scope of the present invention and defined by the following claims.

We claim:
1. A reactor for the deposition of epitaxial layers from a vapor phase on crystalline substrates comprising a susceptor rotatable about its axis and heated by means of electrical currents induced by turns of a coil, said susceptor being housed in a bell jar of insulating and optically transparent material, such as quartz, said bell jar being surrounded by a reflector for reflecting to said susceptor the heat irradiated therefrom during operation, said reflector being formed by optically finished internal sides of the turns of the coil, said turns being hollow conductors through which a cooling liquid flows, said turns being spaced apart from each other so as to have minimal discontinuities of the reflector and being fixed in a mechanically steady configuration, and means for controlling local variations in the magnetic field inside the coil, necessitated by required local power variations in said susceptor, said means subtracting or adding reactive currents from or to turns of the coil corresponding to susceptor regions in which said power variations are required.

2. A reactor as in claim 1 wherein the turns are provided by ring-shaped conductors, lying on planes substantially perpendicular to the susceptor axis in order to induce therein electrical currents perpendicular to said axis, to avoid heating pulsations connected with a perpendicular lack of said currents with respect to said susceptor axis and with the rotation of the susceptor.

3. A reactor as in claim 1 further including means for air cooling said bell jar, said cooling means including a blower, a nozzle and swirl generator for causing the air to flow between said bell jar and said coil and then outwardly from about said bell jar, a heat exchanger for cooling the air leaving said bell jar and means to pass cooled air from the heat exchanger to said blower.

4. A reactor as in claim 3 further including a pressurizing chamber surrounding the coil, the arrangement being such that air from said blower passes first to the pressurizing chamber and then passes between the bell jar and the coil both through said nozzle and swirl generator and through supplementary taps consisting of gaps between the turns of said coil.

5. A reactor as in claim 1 wherein the means to subtract reactive current from turns of said coil include inductors connected between said turns and the means to add reactive current to said turns include capacitors connected between said turns.

6. A reactor as in claim 5 wherein said inductors are variable.

7. A reactor as in claim 6 wherein at least one of said inductors is variable by connecting its taps to a short circuit conductor or bridge.

8. A reactor as in claim 6 wherein at least one of said inductors is variable by means of a ferromagnetic core movable therein.

9. A reactor as in claim 5 wherein at least one of said capacitors is variable.

10. A reactor as in claim 9 wherein at least one of said capacitors is incrementally variable by means of a shunt connecting a selectable number of capacitors members.

11. A reactor as in claim 5 including at least one inductor and capacitor combination.

12. A reactor as in claim 11 wherein said at least one inductor and capacitor combination is a parallel combination thereof with a capacitor variable by increments and an inductor variable by means of a ferromagnetic movable core.

13. A reactor as in claim 11 wherein said at least one inductor and capacitor combination is a series combination thereof with a capacitor variable by increments and an inductor variable by means of a ferromagnetic movable core.

14. A reactor as in claim 13 further including a voltage limiting member connected across said capacitors to limit overvoltages which could be formed in said capacitors near resonance conditions.

15. A reactor as in claim 1 wherein said coil is provided with ferromagnetic blocks for guiding and limiting the magnetic field outside the coil.

16. A reactor as in claim 15 wherein said blocks have an angular shape and are provided around the top and the bottom edge of said coil.

17. A reactor as in claim 16 wherein said blocks consist of ferromagnetic lamination steps.

18. A reactor as in claim 16 wherein said blocks consist of ceramic ferrite.

19. A reactor as in claim 15 wherein said ferromagnetic blocks are connected by an external ferromagnetic shell around the outside of said coil.

20. A reactor as in claim 19 wherein said blocks and said shell consist of ceramic ferrite.

21. A reactor as in claim 18 wherein said ferrite blocks are connected by ferrite columns outside said coil.

22. A reactor as in claim 1 wherein said susceptor includes a conducting shell and has the shape of a truncated pyramid with a regular polygonal base, the base having an external and an internal surface, and wherein the internal surface of said shell is provided with depressions aligned and substantially coextensive with pockets or indentations on said external surface accomodating wafers of slices of material to be treated.

23. A reactor as in claim 22 wherein thickness variations of the susceptor compensate for induced power variations associated with the pyramidal shape of said susceptor.

24. A reactor as in claim 22 wherein said depressions are planar depressions having the shape of circular trenches, surrounding a central area substantially at the same level of said internal surface.

25. A reactor as in claim 22 wherein said depressions are circular trenches bevelled starting from a central axis substantially at the same level of said internal surface.

26. A reactor as in claim 22 wherein said depressions are generally conical surfaces on the internal face of said susceptor and have vertices substantially aligned with the centers of said pockets.

27. A reactor as in claim 22 wherein the susceptor has lateral corners which are provided with bevellings larger outside than inside in order to maintain constant, or reduce locally, the susceptor thickness and thus maintain, or increase locally, the current density in the same.

* * * * *